United States Patent [19]

Kosonocky

[11] Patent Number: 4,774,557
[45] Date of Patent: Sep. 27, 1988

[54] BACK-ILLUMINATED SEMICONDUCTOR IMAGER WITH CHARGE TRANSFER DEVICES IN FRONT SURFACE WELL STRUCTURE

[75] Inventor: Walter F. Kosonocky, Montgomery Township, N.J.

[73] Assignee: General Electric Company, Schenectady, N.Y.

[21] Appl. No.: 863,358

[22] Filed: May 15, 1986

[51] Int. Cl.[4] ............... H01L 29/78; H01L 27/14; H01L 31/00
[52] U.S. Cl. ............................. 357/24; 357/30
[58] Field of Search ................... 357/24, 30

[56] References Cited

U.S. PATENT DOCUMENTS

| | | | |
|---|---|---|---|
| 3,864,722 | 2/1975 | Carnes | 357/24 |
| 3,906,543 | 9/1975 | Smith et al. | 357/24 LR |
| 4,142,198 | 2/1979 | Finnila et al. | 357/24 LR |
| 4,450,464 | 5/1984 | Yamada | 357/24 LR |
| 4,656,519 | 4/1987 | Savoye | 357/24 LR |

OTHER PUBLICATIONS

"Design and Performance of 64×128 Element PtSi Schottky-barrier Infrared Charge-Coupled Device (IRCCD) Focal Plane Array", published in SPIE, vol. 344, Infrared Sensor Technology(1982), pp. 66–77.
"160×244 Element PtSi Schottky-barrier IR–CCD Image Sensor", published in *IEEE Transactions on Electron Devices*, vol. ED-32, No. 8, Aug. 1985, pp. 1564–1573.

Primary Examiner—Gene M. Munson
Attorney, Agent, or Firm—Henry I. Steckler; James C. Davis, Jr.; Paul R. Webb, II

[57] ABSTRACT

An imager includes a substrate of single crystalline silicon of one conductivity type having opposed major surfaces. A Schottky-barrier detector junction is along one of the major surfaces for converting detected radiation to charge carriers. An array of collecting electrodes is in the other major surface of the substrate and are of the same conductivity as the substrate but of higher conductivity. The collecting electrodes are adapted to collect the charge carriers created at the Schottky-barrier junction when the substrate is depleted. Surrounding the collecting electrodes is a well of the opposite conductivity type which isolates the collecting electrodes from each other. Within the well and along the other major surface of the substrate is transfer means, such as a charge-coupled device or MOS transistor circuit, for transferring the charge carriers from the collecting electrodes to an output. The well also serves as a barrier for preventing the charge carriers which are flowing from the Schottky-barrier junction to the collecting electrodes from entering the transfer means.

27 Claims, 7 Drawing Sheets

BACK-ILLUMINATED SEMICONDUCTOR IMAGER WITH CHARGE TRANSFER DEVICES IN FRONT SURFACE WELL STRUCTURE

The present invention relates to a semiconductor imager and more particularly, to an interline transfer Schottky-barrier charge-coupled device (CCD) imager having improved fill-factor.

BACKGROUND OF THE INVENTION

One type of solid state imager includes a substrate of single crystalline semiconductor material having along one surface thereof a plurality of detector areas for detecting radiation and converting the radiation to charge carriers, and transfer means along the detector areas for receiving the charge carriers and transferring them to an output terminal. One such type of detector commonly used is a Schottky-barrier detector formed of a layer of a conductive material forming a Schottky-barrier junction with the substrate. One type of transfer means used is a CCD. Such an imager is shown and described in the articles of W. F. Kosonocky et al., entitled "Design and Performance of 64×128 Element PtSi Schottky-barrier Infrared Charge-Coupled Device (IRCCD) Focal Plane Array", published in SPIE, Volume 344, *Infrared Sensor Technology* (1982), pages 66–77 and W. F. Kosonocky et al., entitled "160×244 Element PtSi Schottky-Barrier IR-CCD Image Sensor", published in *IEEE Transactions On Electron Devices*, Vol. ED-32, No. 8, August 1985, pp. 1564–1573. A problem with this type of imager is that the transfer means, such as the CCD, takes up room on the surface of the substrate so as to reduce the fill-factor of the device.

As described in U.S. Pat. No. 3,864,722 to J. E. Carnes, entitled "Radiation Sensing Arrays", issued Feb. 4, 1975, a CCD imager has been developed which has the Schottky-injection detector along one surface of a substrate of semiconductor material and a CCD transfer means along the opposite surface of the substrate. Radiation detected by the Schottky-barrier detector surface is converted to charge carriers and some of the carriers are injected into the substrate. The substrate is depleted so that the charge carriers move across the substrate to the channels of the CCD. Voltages are then clocked to the gates of the CCD to move the charge carriers along the channels to the output of the device. Although this device has an improved fill-factor, since the detector is across the entire surface of the substrate, this deiice has other problems resulting from the CCD being the collector of the charge carriers as well as the transfer means. As one set of charge is being transferred along the channels of the CCD, other charges are being collected. Thus, if a charge is not transferred along the channels fast enough, it can be interferred with by the new charges being collected thus causing smear.

SUMMARY OF THE INVENTION

An imager includes a substrate of semiconductor material of one conductivity type having a pair of opposed major surfaces. Along one of the major surfaces of the substrate is means for converting detected radiation into charge carriers. A plurality of charge collecting regions for the charge carriers of the same conductivity type as the substrate are in the substrate at the other major surface. The substrate includes means extending along the other major surface for receiving the charge carrier from the collecting regions and for transferring the charge carriers region to an output. The substrate also includes means for isolating the collecting regions from each other and for preventing the charge carriers flowing from the connecting means to the collecting region from reaching the transfer means.

DETAILED DESCRIPTION OF PREFERRED EMBODIMENT

Figure 2:
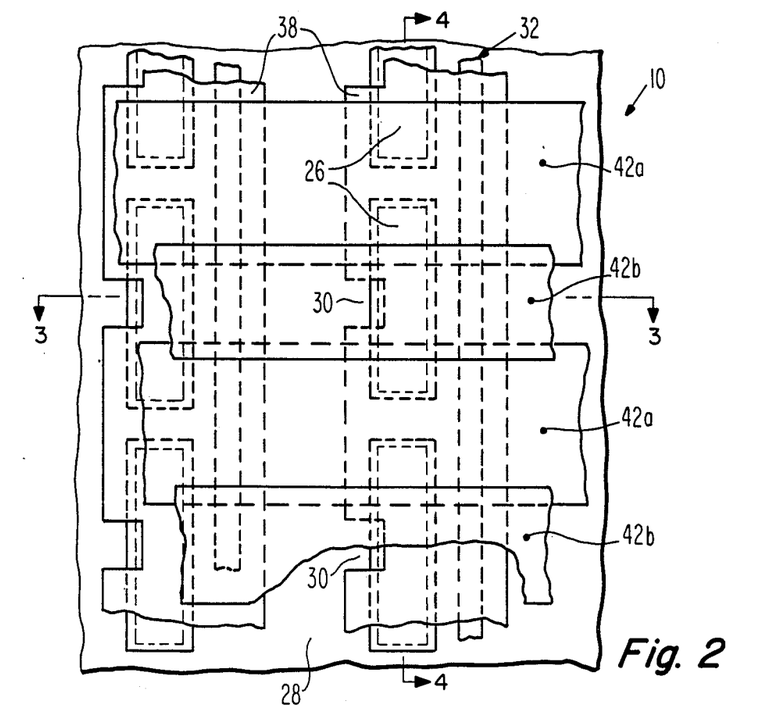
FIG. 2 is a top plan view of a portion of the imager of the present invention.
Figure 3:
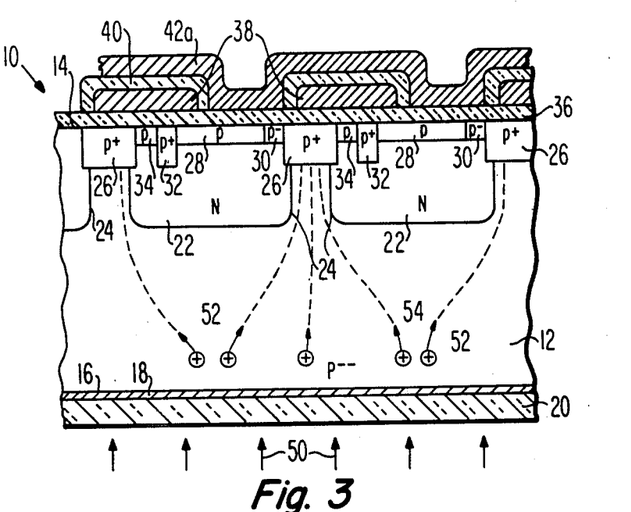
FIG. 3 is a sectional view taken along line 3—3 of FIG. 2.
Figure 4:
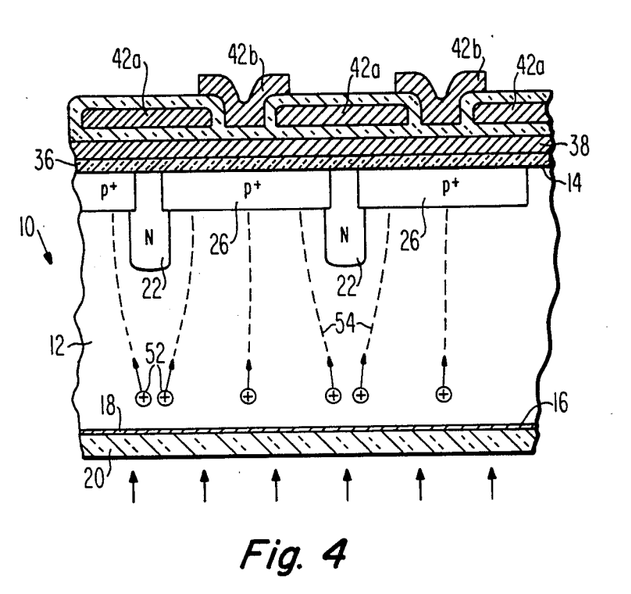
FIG. 4 is a sectional view taken along line 4—4 of FIG. 2.

Referring initially to FIGS. 2–4, one form of the imager of the present invention is generally designated as 10. Imager 10 includes a substrate 12 of a semiconductor material, such as single crystalline silicon, having a pair of opposed surfaces 14 and 16. The substrate 12 is preferably about 25 microns in thickness and of very lightly doped P type (P—) silicon, typically about 1000 ohm-cm. On the surface 16 of the substrate 12 is a thin layer 18 of a conductive material which forms a Schottky-barrier junction with the silicon of the substrate 12, such as platinum silicide. The conductive layer 18 may be coated with a layer 20 of an anti-reflective material, such as silicon oxide.

A N-type conductivity well 22 extends into the substrate 12, typically about 6 microns, from the surface 14. The well 22 has a plurality of openings 24 therethrough to the substrate surface 14. As shown in FIG. 2, the openings 24 are arranged in spaced, parallel rows and columns over the substrate surface 14 with the spacing between the columns being greater than the spacing between the rows. A charge collecting electrode 26 extends into the substrate 12 from the surface 14 in each of the openings 24 in the well 22. The charge collecting electrodes 26 are regions of the same conductivity type as the substrate 12 but of higher conductivity, i.e. P+ type conductivity. This provides a plurality of rows and columns of the charge collecting electrodes 26.

Between each adjacent pair of columns of the charge collecting electrodes 26 and within the well 22 is a buried channel 28 of a CCD. Each buried channel 28 is a region of P type conductivity extending into the substrate 12 from the surface 14 and extending longitudinally along the substrate surface 14 between and parallel to the columns of the charge collecting electrodes 26. Each of the buried channels 28 is spaced from its adjacent columns of the charge collecting electrodes 26. However, at each of the collecting electrodes 26 in one of the adjacent columns the buried channel 28 has a connecting region 30 extending to and contacting the respective collecting electrode 26. Thus, each buried channel 28 is electrically connected to all of the charge collecting electrodes 26 in one adjacent column. The connecting regions 30 can be of the same conductivity type as the buried channels 28 but more lightly doped, i.e. P−, type, or can be of the opposite conductivity type, i.e. N type. Between each of the buried channels 28 and its other adjacent column of collecting electrodes 26 is an overflow drain 32. Each overflow drain 32 is a region of the same conductivity type as that of the buried channel 28 but of higher conductivity, i.e. P+ type conductivity, extending into the substrate 12 from the surface 14 to a depth greater than the depth of the buried channel 28. Between each of the overflow drains 32 and its adjacent column of collecting electrodes 26 is a barrier region 34 of the same conductivity type as the channel 28 and of a conductivity the same as or less than that of the buried channels 28.

Covering the substrate surface 14 is a layer 36 of an insulating material, such as silicon oxide or a layer of silicon nitride over a layer of silicon oxide. On the insulating layer 36 are a plurality of spaced, parallel field-shield gates 38 which extend over and parallel to the columns of the charge collecting electrodes 26. The field-shield gates 38 are of a conductive material, such as doped polycrystalline silicon. Each field-shield gate 38 is of a width to extend from the edge of one buried channel region 28, across the width of its respective charge collecting electrode 26, the adjacent barrier region 34, overflow drain 32, and a portion of the buried channel 28 adjacent the overflow drain 32. However, as shown in FIG. 2, the field-shield gate 38 has recesses in its edge at the connecting regions 30 so that it does not extend over the connecting regions 30. Each of the charge collecting electrode gates 38 is covered with a layer 40 of an insulating material, such as silicon oxide.

Figure 1:
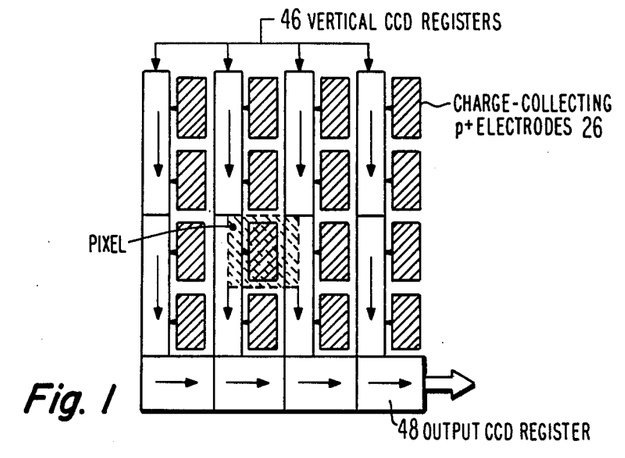
FIG. 1 is a schematic view of the imager of the present invention.

Two sets of CCD transfer gates 42a and 42b extend transversely across the buried channels 28 and the charge collecting electrode gates 38. The transfer gates of each se are in spaced, parallel relation with the transfer gates of one set being between adjacent gates of the other set. Each of the gates 42b extends across a connecting region 30 in each CCD. As shown in FIGS. 1 and 4, the CCD transfer gates 42b each overlap portions of the adjacent gates 42a and are insulated therefrom by a layer 44 of an insulating material, such as silicon oxide, which is on the gates 42a. The CCD transfer gates 42a and 42b are of a conductive material, such as doped polycrystalline silicon.

Thus, as schematically shown in FIG. 1, the imager 10 has along the surface 14 of the substrate 12 a plurality of spaced, parallel columns of the charge collecting electrodes 26. The charge collecting electrodes 26 in each column are electrically connected to a CCD 46 which extends longitudinally between the columns of the charge collecting electrodes. Each of the CCDs 46 is made up of a buried channel 28 and the transfer gates 42a and 42b. An output CCD register 48 extends across the ends of the columns of the charge collecting electrodes 26 and is electrically connected to the CCDs 46. The channel of the output CCD register 48 is also formed in the well 22. The output CCD register 48 is adapted to receive charges from the CCDs 46 and transfer the charges to an output of the imager 10.

In the operation of the imager 10, radiation is directed at the surface 14 of the substrate 12 as indicated by the arrows 50 in FIGS. 3 and 4. The radiation is absorbed in the conductive layer 16, and is converted to hot charge carriers which are injected across the Schottky-barrier junction into the substrate 12. The wavelength of the radiation absorbed is determined by the barrier height of the Schottky-barrier junction which, in turn, is determined by the particular material of the substrate 12 and the conductive layer 16. The Schottky-barrier formed between a platinum silicide conductive layer 16 and a silicon substrate 12 will absorb infrared radiation having a wavelength up to about 5 microns and also ultra-violet radiation. The type of charge carriers generated depends on the conductivity type of the substrate 12. For a substrate 12 of P type conductivity "holes" are generated in the substrate 12 as indicated by the plus marks 52 in FIGS. 3 and 4.

A potential difference is generated between the conductive layer 16 and the charge collecting electrodes 26 which depletes the substrate 12 completely between the conductive layer 16 and the charge collecting electrodes 26. This causes the charge carriers 52 to follow the electric field lines as indicated by the dash lines 54 from the conductive layer 16 to the charge collecting electrodes 26. The charge collecting electrodes 26 are electrically isolated from each other by the wells 22 of opposite conductivity type which also act as potential barriers for the charge carriers so that the charge carriers will flow to the charge collecting electrodes 26. Thus, the charge collecting electrodes 26 serve to collect the charge carriers which are generated by the incoming radiation at the substrate surface 16.

Figure 5:
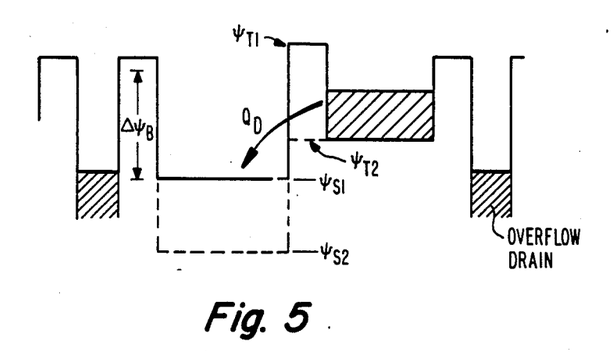
FIG. 5 is a profile of the potentials developed in one pixel of the CCD of the imager of the present invention.
Figure 6:
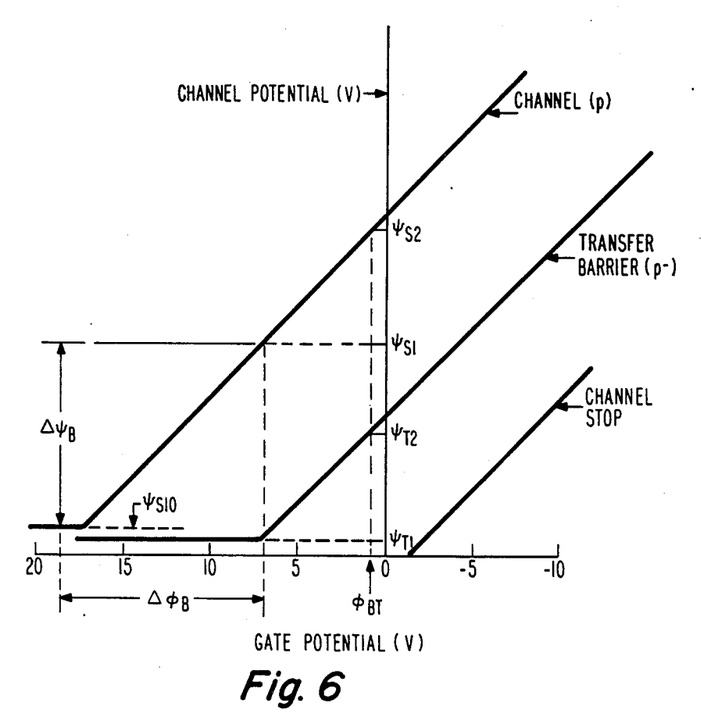
FIG. 6 is a diagram of the potentials for operation of the imager of the present invention.

As shown in the diagrams of FIGS. 5 and 6, when the transfer gates 42b are pulsed to a potential $\phi_{BT}$, a potential $\psi_{T2}$ is applied to the transfer region 30 and a potential $\psi_{S2}$ is applied to the portion of the buried channel 28 under the gate 42b. This lowers the barrier provided by the transfer region 30 to the level of the potential well in the charge collecting electrode 26 and also lowers the potential well in the buried channel 26. Thus, the charge signal ($Q_D$), which collected in the charge collecting electrode 26, will flow into the buried channel 26. The gates 42a and 42b are then clocked to transfer the charge signal ($Q_D$) along the buried channel 26 to the output CCD register 48 where the charges are clocked to the output of the imager 10. During the clocking of the transfer gates 42a and 42b the clock voltage $\theta_B$ results in a buried channel potential changes of $A\psi_B = \psi_{S1} - \psi_{S10}$ while maintaining a barrier potential, $\psi_{T1}$, between the buried channel 28 and the potential well of the charge collecting electrode 26.

Instead of using a potential applied to the transfer gates 42b of the CCD column registers to cause the charge to be transferred from the charge collecting electrodes 26 to the buried channel 28 of the CCD, a separate transfer gate can be formed over and insulated from the edge portion of the field-shield 38 which extends between the charge collecting electrodes 26 and the buried channel 28. The transfer gate would extend parallel to the field-shield 38, a column of the charge collecting electrode 26 and the buried channel 28 so as to extend over a column of the connecting regions 30. The connecting region 30 would then be formed of the same conductivity type and conductivity as the buried channel 28. The transfer gates 42a and 42b of the CCD column register would extend over and be insulated from the separate transfer gates.

The field-shield gates 38 serve several functions. A voltage applied to the field-shield gates 38 increases the capacitance, and thus the charge handling capacity, of the charge collecting electrodes 26. They also provide the barriers between the blooming drain 32 and the charge collecting electrodes 26 on one side and the buried channel 28 on the other side and between the charge collecting electrodes 26 and the buried channel 28 to which the charge collecting electrodes are connected by the connecting regions 30.

Figure 7:
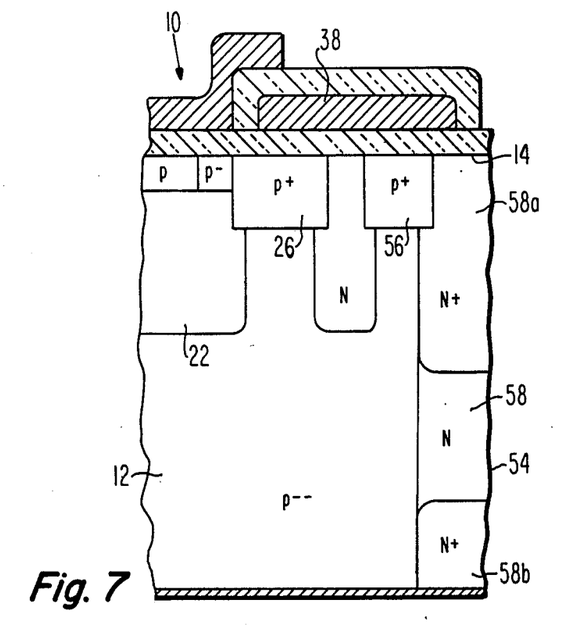
FIG. 7 is a sectional view of the edge portion of the imager of the present invention.

As shown in FIG. 7, the imager 10 can be formed with the charge collecting electrodes 26 being close to an edge 54 of the substrate 12. A P+ drain region 56 is provided between the substrate edge 54 and the adjacent charge collecting electrodes 26 to collect any edge leakage current. A N type passivation region 58 is provided along the edge 54 between the surfaces 14 and 16 to minimize any edge leakage current. This structure allows the charge collecting electrodes 26 to be close to the substrate edge 54 so that two of the imagers 10 can be placed in edge abutting relation to provide a large imager with a minimum of loss space between the columns of the charge collecting electrodes 26 on the two imagers. By making the portions 58a and 58b of the passivation region 58 which are adjacent the major surfaces 14 and 16 of the substrate 12 highly conductive, i.e. N+ type, the passivation region 58 can also serve as a contact to the conductive layer 18 on the substrate surface 16. This allows all of the terminals for the imager 10 to be at one side of the imager and also allows the imager 10 to be mounted on a support for providing greater strength to the imager.

Figure 8:
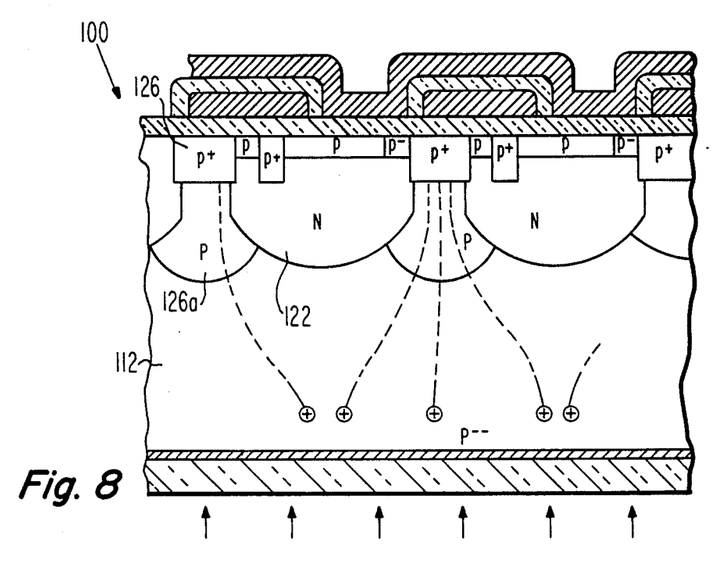
FIG. 8 is a sectional view of a portion of a modification of the imager of the present invention.

A modification of the CCD imager of the present invention, generally designated as 100, is shown in FIG. 8. The CCD imager 100 is similar in structure to the CCD imager 10 shown in FIGS. 3 and 4 except that the charge collecting electrodes 126 have extensions 126a of P type conductivity of a conductivity greater than that of the substrate 112 but less than the charge collecting electrodes 126. The extensions 126a extend into the substrate 112 a distance at least equal to and preferably greater than the depth of the well 122, typically about 7 to 8 microns. This extension 126a provides a more gradual doped transistion from the heavily doped charge collecting electrode 126 to the very lightly doped substrate 12 to reduce leakage currently preventing the depletion of the substrate 12 from reaching the collecting electrode 126. places the charge collecting region closer to the Schottky-barrier detection junction at the surface 116 and also increases the area of the charge collecting region so as to improve the charge collecting efficiency.

Figure 9:
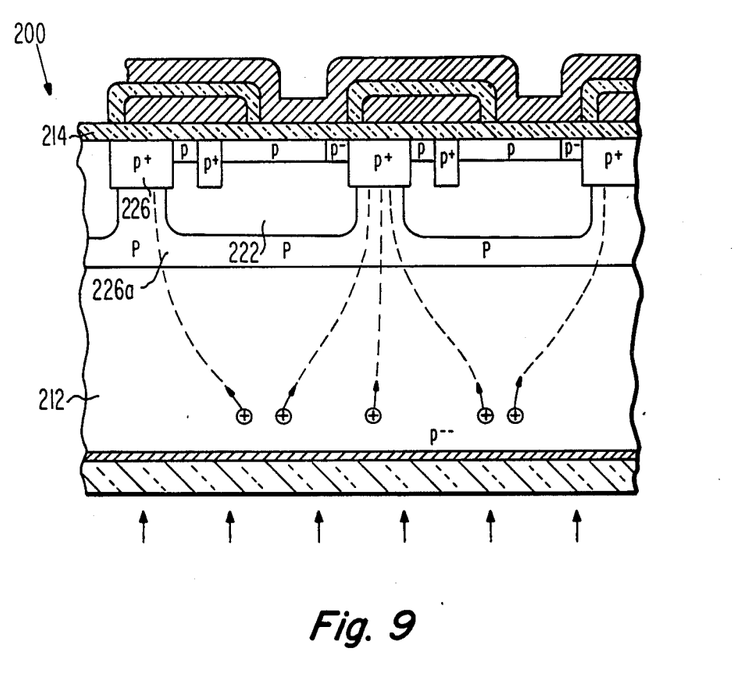
FIG. 9 is a sectional view of a portion of another modification of the imager of the present invention.

Another modification of the imager of the present invention is shown in FIG. 9 and is generally designated as 200. Imager 200 is similar in construction to the imager 100 shown in FIG. 8 except that the extension 226a of the charge collecting electrodes 226 extends completely across the substrate 212 and under the wells 222. In making the imager 200, the charge collecting electrode extensions 226a can be formed by embedding P type conductivity modifiers, such as boron, into the substrate surface 214 across the entire substrate 212 either by diffusion or ion implantation. The well 222, charge collecting electrodes 226 and other features of the device would then be formed in the P type region.

For example, the well 122 can be formed by implanting phosphor ions into the substrate 112 at 100 KeV and a dosage of $3 \times 10^{12}$ cm$^{-2}$ and the extension 226a can be formed by implanting boron into the substrate 112 at 50 KeV and a dosage of $10^{12}$ cm$^{-2}$. After the imager 200 is completed, the phosphor and boron ions will have been subjected to a heat treatment equivalent to 4 hours at 1200° C. and 8 hours at 1200° C. respectively. This will provide an extension 226a which extends about 7 to 8 microns below the substrate surface 114 and a well 122 which extends about 4 microns below the substrate surface 114. Alternatively, the charge collecting electrode extension 226a can be formed by epitaxially growing a layer of P type semiconductor material on the substrate 212 and then forming the various elements of the device in the epitaxial layer.

Figure 10:
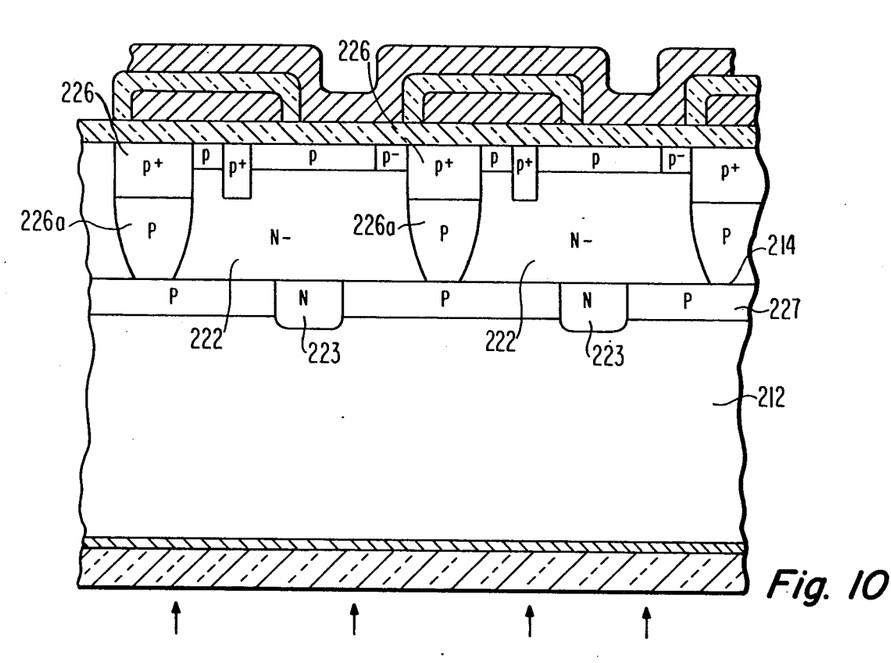
FIG. 10 is a sectional view of a portion of still another modification of the imager of the present invention.

Another method of making the imager 200 is shown in FIG. 10. For this method a layer 227 of P type conductivity is formed in the substrate 212 across the major surface 214 either by ion implantation or diffusion. Barrier regions 223 of N type conductivity are formed in the substrate 214 across the layer 227 in the areas between where the charge collecting electrodes 226 are to be formed. An epitaxial layer of N type conductivity is deposited on the substrate surface 214 and regions of P type conductivity are formed through the epitaxial layer to the P type layer 227, such as by ion implantations or diffusion, to form the extension 226c. The P type regions are heavily doped at the surface of the epitaxial layer to form the charge collecting electrodes 226. The portion of the epitaxial layer around the charge collecting electrodes 226 form the well 222. The parts of the CCD are then formed in the well 222.

Figure 11:
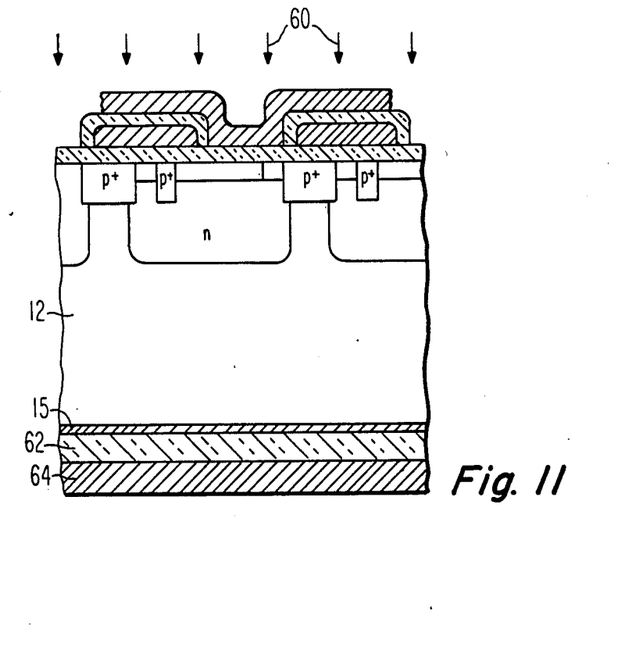
FIG. 11 is a sectional view of a portion of a further modification of the imager of the present invention.

Although the operation of the imager of the present invention has been described with the radiation impinging directly on the side of the imager having the Schottky-barrier detector, the imager can be operated with the radiation impinging on the side of the imager having the CCD transfer device as indicated by the arrows 60 in FIG. 11. For such an operation the conductive layer 16 would be coated with a dielectric layer 62, such as of silicon oxide, about one-quarter wavelength in thickness, and a layer 64 of a reflective material, such as aluminum, over the dielectric layer 62. The dielectric layer 62 and reflective layer 64 form an optical cavity which would reflect any radiation passing through the conductive layer 18 back to the substrate 12 to be absorbed at the Schottky-barrier junction. This greatly increases the absorption of the radiation in the conductive layer 18. This construction also allows the imager 10 to be easily mounted on a cooling means, such as the cold plate of a Dewar assembly, which improves the operation of the device. However, this manner of operating the imager has a disadvantage in that the radiation must pass through the gates 38 and 42 and the substrate 12 before reaching the Schottky-barrier detector. This could result in some loss of the radiation.

Figure 12:
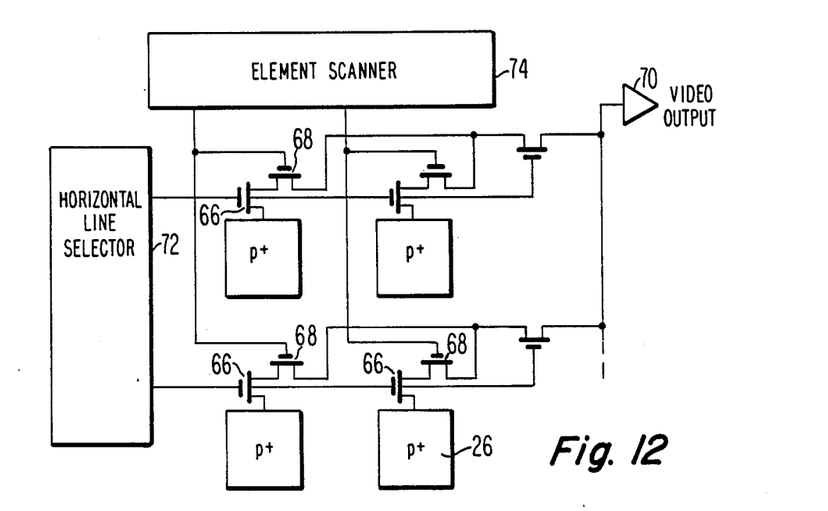
FIG. 12 is a block diagram of another modification of the imager of the present invention using an alternative transfer means.

Although the imagers of the present invention have been described as using a CCD to transfer the charges from the charge collecting electrodes to the output of the imager, other types of transfer means can be used instead of the CCD. For example, as shown in FIG. 12, MOS transistor transfer means can be used. The particular MOS transistor transfer means shown in FIG. 12 includes a pair of MOS transistor 66 and 68 connected in series to each charge collecting electrode 26. All of the MOS transistors 66 and 68 are formed in the well 22 so as to be isolated from the charge collecting electrodes 26. The source of the transistor 66 of each pair is connected to its respective charge collecting electrode 26 and the drain of the other transistor 68 of each pair is connected to the output 70. The gates of each of the transistors 66 for each row of charge collecting electrodes 26 are connected by a common line to a horizontal line selector 72 and the gates of the transistor 68 for each column of the charge collecting electrodes are connected by a common line to an element scanner 74. This provides an x-y scanner for the charge collecting electrodes 26 so that the charges from each of the charge collecting electrodes 26 can be transferred in the proper order to the output 70.

The imager of the present invention with interline transfer, buried channel CCD, has been described as a storing type of sensing device. However, this device can be used as a time delay integration line sensing device as is generally known in the art of visible imager sensors. Time delay integration line sensing can be achieved by synchronizing the scanning motion of the imager with the clocking of the CCD column registers and transferring the detected charges from the charge collecting electrodes to the buried channel of the CCD column registers over for each clock of the register.

Thus, there is provided by the present invention an imager which includes a detector along one major surface of a substrate for receiving radiation and converting the radiation to charge carriers within the substrate, and along the opposed major surface of the substrate collecting electrodes for collecting the charge carriers and transfer means for transferring the charge carriers from the collecting electrodes to an output. By having the detector along one entire surface of the substrate and the collector electrodes and transfer means along a different surface, the fill-factor of the image is improved for improved sensitivity and reduction of aliasing of the image being detected. By having the means for collecting the charge carriers separate from the means for transferring the charge carriers, there is no interference between the carriers being transferred and the new carriers being collected. This reduces the possibility of smear.

I claim:

1. An imager comprising:
 a substrate of semiconductor material of one conductivity type having a pair of opposed major surfaces
 a continuous laminar layer of material along one of said major surfaces, said material of a type forming a junction with said substrate, said junction being adapted for being co-extensive with a radiant energy image, for converting with essentially 100% fill factor factor detected radiation into charge carriers and injecting them as majority charge carriers into the substrate;
 a plurality of collecting regions for the charge carriers in said substrate at the other of said major surfaces, said collecting regions being of the same conducitivity type as the substrate;
 means for depleting said substrate of free charge carriers so as to provide for transport of the injected majority charge carriers from the entire surface of said junction to the collecting regions;
 transfer means along said other major surface of the substrate for receiving the transferred majority charge carriers from teh collecting regions and transferring the charge carriers to an output; and
 means in said substrate for isolating said collecting regions from each other and for preventing the charge carriers flowing from said junction to the collecting regions form reaching the transfer means.

2. An imager in accordance with claim 1 wherein the means for isolating the collecting regions comprises a well of a conductivity type opposite to that of the substrate, within the substrate at the other major surface, said well having a plurailty of openings therethrough at said other major surface, and wherein each of said collecting regions is in a separate one of said openings.

3. An imager in accordance with claim 2 in which said transfer means is along said well.

4. An imager in accordance with claim 3 in which each of said collecting regions has a conductivity considerably higher than that of the substrate.

5. An imager in accordance with claim 4 in which each of said collecting regions includes an extension of a conductivity between that of the substrate and the collecting region which extends into the substrate from the collecting region to a depth at least as great as the depth of the well, said extension being of a conductivity which prevents the depletion region from reaching the collecting region.

6. An imager in accordance with claim 4 in which the transfer means is a charge-coupled device.

7. An imager in accordance with claim 6 in which the charge transfer device incldues a buried channel region of the same conductivity type as the substrate within the well and along the other major surface and a plurality of conductive transfer gates over and insulated from said other major surface and extending in parallel realtion transversely across the channel region.

8. An imager in accordance with claim 7 wherein the collecting regions are arranged in a column, the charge-coupling device channel region extends along and is spaced from said column of collecting regions and has individual connecting regions extending to each of said collecting regions.

9. An imager in accordance with claim 7 in which the collecting regions are arranged in an array of a plurality of spaced, parallel columns with a plurality of the collecting regions in each column, a separate charge coupling device transfer means extends along each column of collecting regions with the channel region of each charge-coupling device being connected to each of the collecting regions in one of the adjacent columns.

10. An imager in accordance with claim 9 in which the channel region of each charge-coupled device has a separate extension extending to each of the collecting regions of the adjacent column to connect the channel region to the connecting regions.

11. An imager in accordance with claim 10 in which the transfer gates extend transversely across all of the channel regions.

12. An imager in accordance with claim 4 in which the charge transfer means includes at least one separate MOS transistor connected between each charge collecting region and the output with the MOS transistor being formed in the well.

13. An imager in accordance with claim 12 including a pair of MOS transistors connected in series between each charge collecting region and the output and means for operating the transistor to transfer the charges from the charge collecting region to the output in the proper order.

14. An imager in accordance with claim 1 wherein said laminar layer of material is of a material forming a Schottky barrier junction with said substrate.

15. An imager comprising:
   a substrate of semiconductor material of one conductivity type having a pair of opposed major surfaces;
   means along one of said major surfaces for converting with essentially 100% fill factor, detected radiation into charge carriers and injecting them into the substrate as majority charge carriers;
   a plurality of collecting regions for the majority charge carriers in said substrate at the other of said major surfaces, said collecting regions being of the same conductivity type as the substrate and having a conductivity considerably higher than that of the substrate;
   means for depleting said substrate of free charge carriers so as to provide for transport of essentially all of the injected majority charge carriers to the collection regions;
   a well of a conductivity type opposite to that of the substrate within the substrate at the other major surface, said well having a plurality of openings therethorugh at said other major surface, each of said collecting regions being in a separate one of said openings, said well isolating said collecting regions from each other;
   transfer means along said well and said other major surface of the substrate for receiving the majority charge carriers from the collecting regions and transferring the charge carriers to an output, said well preventing the charge carriers flowing from the converting means to the collecting regions from reaching the transfer means; and
   a respective extension of each of the collecting regions, each which extension extends into the substrate from its collecting region to a depth greater than the depth of the well and is of a conductivity between that of its collecting region and the substrate so as to prevent the depletion region from reaching the collecting region.

16. An imager in accordance with claim 15 in which the extension of the collecting regions extends across the substrate and under the well.

17. An imager in accordance with claim 16 including barrier regions of the same conductivity type as the well extending from the well and across the portion of the extensions under the well.

18. An imager comprising:
   a substrate of semiconductor material of one conductivity type having a pair of opposed major surfaces;
   a continuous laminar layer of material along a first of said major surfaces, asid material of a type forming a junction with said substrate, said junction being adapted for being co-extensive with a radiant energy image, for converting, with essentially 100% fill factor, detected radiation into charge carriers and injecting them as majority charge carriers into said substrate;
   a well of a conductivity type opposite to that of said substrate extending into the second major surface of said substrate, said well having a plurality of openings therethrough arranged in at least one column;
   a plurality of collecting regions for the charge carriers, said collecting regions arranged in said substrate at the second major surface thereof and within respective openings of said well, each of said collecting regions being of the same conductivity type as the substrate and having a conductivity considerably higher than that of the substrate;
   means for depleting the substrate of free charge carriers, so as to provide for the transport to the collecting regions of the majority charge carriers from the entire surface of said junciton; and
   means along the second major surface of the substrate for receiving the charge carriers from the collecting regions and transferring the charge carriers to an output, which means includes in parallel with each column of openings in said well and spaced apart therefrom
   a respective charge-coupled device, said charge-coupled device including a buried channel region of the same conductivity type as the substrate within the well and along the second major surface, said charge-coupled device including a plurality of conductive transfer gates over and insulated from said second major surface and extending in parallel relation transversely, across the buried channel region, said buried channel region having individual connecting regions in the column of openings in said well with which it is respectively associated.

19. An imager in accordance with claim 18 in which a separate one of the transfer gates extends over each of the conencting regions and the connecting regions are of the same conductivity type as but lower conductivity than the channel regions.

20. An imager in accordance with claim 18 in which a separate one of the transfer gates extends over each of the connecting regions and the connecting regions are of a conductivity type opposite to that of the channel regions.

21. An imager in accordance with claim 18 including a field-shield gate extending over and insulated from said other major surface of the substrate over and along said column of collecting regions and the transfer gates extend over and are insulated form the field-shield gate.

22. An imager as set forth in claim 18 wherein there is a plurality of columns of openings in said well wherein respective collecting regions are disposed, said columns being parallely disposed respective to each other and aligned at their ends, and wherein respective pluralities of the transfer gates that extend transversely across each of the channel regions are portions of transfer gate structures that extend continuously across all of the channel regions.

23. An imager in accordance with claim 22 including a separate conductive field-shield gate extending over and insulated from said other major surface of the substrate over and along each column of collecting regions and the transfer gates extend over and are insulated from the field-shield gates.

24. An imager in accordance with claim 23 including a separate overflow drain region in the well and along said other major surface of the substrate between each channel and the other adjacent column of collecting regions, each overflow drain being of the same conductivity type as the channel regions but of higher conductivity and extending into the substrate a distance greater than the depth of the channel region.

25. An imager in accordance with claim 24 in which each overflow drain region is spaced from the other column of collecting regions, a barrier region is between the overflow drain region and the other column of collecting regions, and a barrier is between the overflow drain region and the adjacent channel.

26. An imager in accordance with claim 25 in which each of the field-shield gates is of a width to extend over the barrier regions on each side of the charge collecting regions, adjacent overflow drain region, and barrier region between the overflow drain region and the adjacent channel.

27. An imager in accordance with claim 26 in which the substrate is of P type conductivity, the well is of N type conductivity, the collecting regions are of P type conductivity and the charge-coupled device channel and overflow drain are of P type conductivity.

* * * * *